United States Patent [19]

Takasu et al.

[11] Patent Number: 5,128,745
[45] Date of Patent: Jul. 7, 1992

[54] SEMICONDUCTOR DEVICE WITH THIN FILM RESISTOR

[75] Inventors: Hiroaki Takasu; Yoshio Hattori, both of Tokyo, Japan

[73] Assignee: Seiko Instruments Inc., Japan

[21] Appl. No.: 547,785

[22] Filed: Jul. 3, 1990

[30] Foreign Application Priority Data

Jul. 5, 1989 [JP] Japan .................................. 1-174787
Jul. 10, 1989 [JP] Japan .................................. 1-178810
Jul. 10, 1989 [JP] Japan .................................. 1-178812

[51] Int. Cl.$^5$ ..................... H01L 23/48; H01L 29/44; H01L 29/52; H01L 29/60
[52] U.S. Cl. ........................................ 357/68; 357/65; 357/51; 357/71
[58] Field of Search ..................... 357/51, 65, 68, 71

[56] References Cited

U.S. PATENT DOCUMENTS

| | | | |
|---|---|---|---|
| 4,510,518 | 4/1985 | Van Vonno | 357/49 |
| 4,536,231 | 8/1985 | Kasten | 148/33.1 |
| 4,905,070 | 2/1990 | Lesk et al. | 357/51 |

Primary Examiner—Rolf Hille
Assistant Examiner—David Ostrowski
Attorney, Agent, or Firm—Bruce L. Adams; Van C. Wilks

[57] ABSTRACT

The semiconductor device is integrated with a thin film resistor composed of a resistive thin film. A contact hole is covered with the resistive thin film through which electrical contact is made to a substrate or a gate electrode so as to facilitate formation of an inter-layer insulating film between the thin film resistor and a patterned metal film. Electrical connection is effected between the thin film resistor and the patterned metal film made of aluminium through an impurity-doped region of high density, or a pair of polysilicon layers are disposed on upper and lower faces of the thin film resistor. By such construction, excessive removal of the thin film resistor can be prevented, which would be otherwise caused due to overetching during the course of etching of an insulating film over the thin film transistor prior to the formation of the patterned aluminium film.

9 Claims, 3 Drawing Sheets

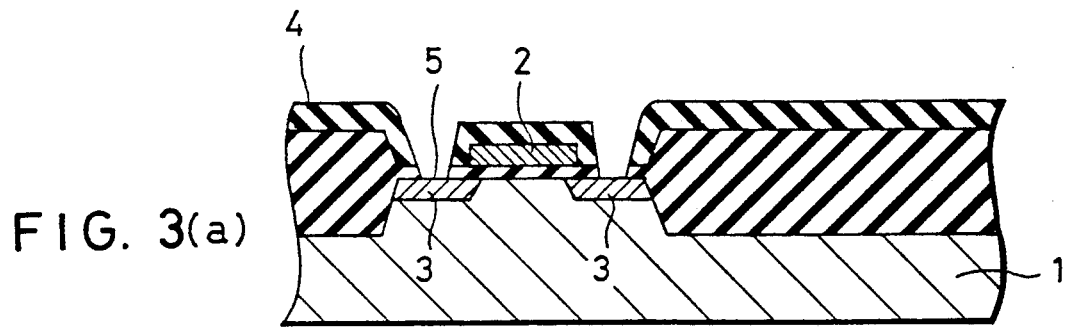
F I G. 3(a)
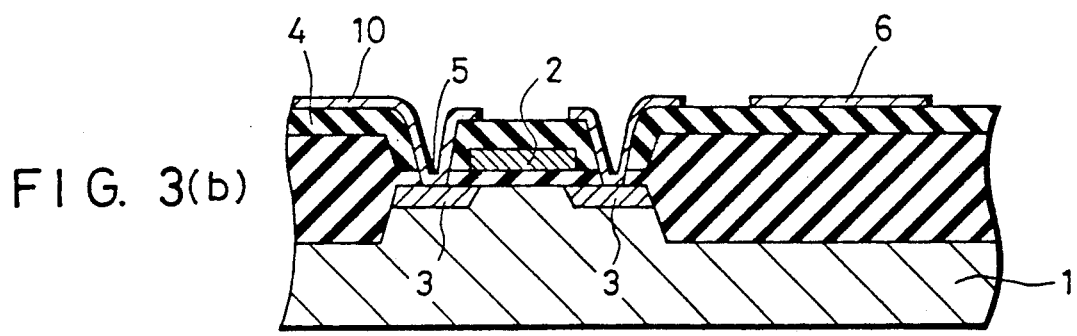
F I G. 3(b)
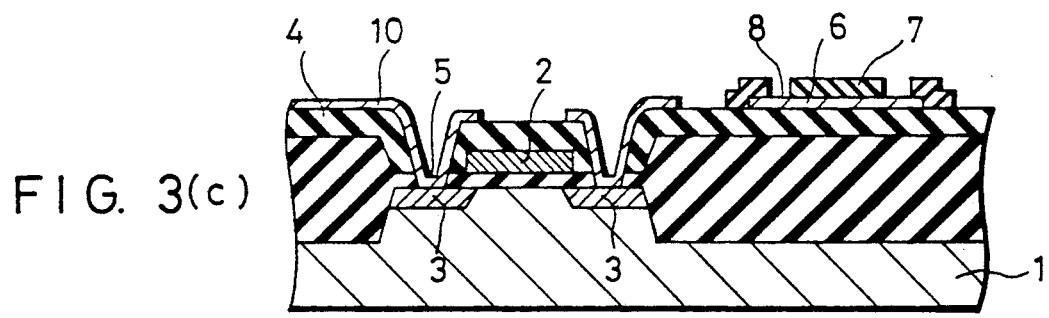
F I G. 3(c)
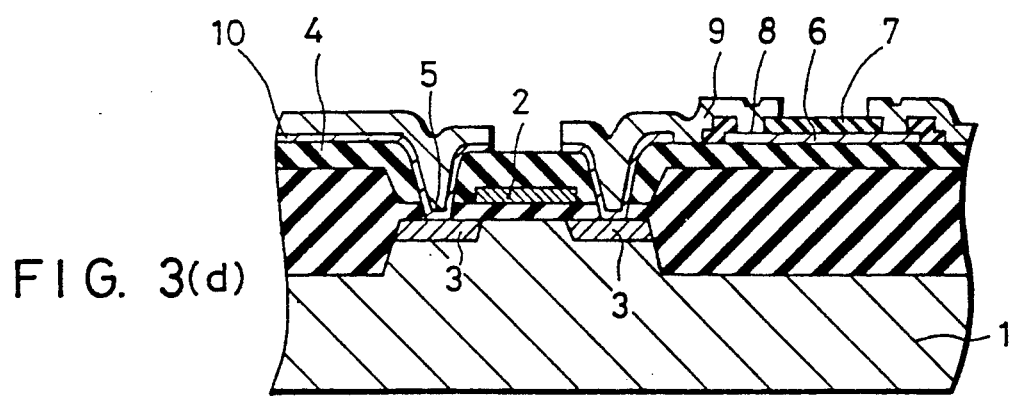
F I G. 3(d)

SEMICONDUCTOR DEVICE WITH THIN FILM RESISTOR

BACKGROUND OF THE INVENTION

The present invention generally relates to a semiconductor device, and more specifically relates to a semiconductor device of the type having a thin film resistor, such as an analog IC. The analog IC contains as one component a high resistance circuit which can be composed of a thin film resistor. The thinner the film thickness, the higher the resistance value.

FIG. 2 is a structural sectional view of the conventional semiconductor device having a thin film resistor. A semiconductor substrate 21 is formed thereon with a MOS transistor composed of a gate electrode 22 and a pair of source and drain regions 23. An inter-layer insulating film 24 is deposited over the source and drain regions 23, and the gate electrode 22. Thereafter, a contact hole 25 is opened in the insulating film 24 to effect electrical interconnection through a patterned metal film 29. Further, another inter-layer insulating film 27 is disposed on a thin film resistor 26 which can be connected to the patterned metal film 29 through a contact hole 28 formed in the inter-layer insulating film 27.

In the conventional semiconductor device having a thin film resistor, the contact hole 25 is covered temporarily with the inter-layer insulating film 27 when the film 27 is formed over the thin film resistor 26. During the course of etching and removing of this inter-layer insulating film 27, the precedingly formed contact holes 25 are also etched to cause broadening of the diameter of the contact hole 25 and therefore variation of the contact hole diameter.

For this reason, in the semiconductor device having a thin film resistor, considerable margin is needed for design dimension around a contact hole 25, thereby hindering micronization of the device. Moreover, mask patterns designed for a regular semiconductor device having no thin film resistor cannot be utilized as it is, thereby increasing additional design work.

Further, in the conventional semiconductor device, when etching the insulating film 27 prior to formation of the patterned metal film 29 made of aluminum, there might be caused overetching, resulting in the drawback that the thin film resistor 26 is removed away.

SUMMARY OF THE INVENTION

In order to solve the above noted problem of the prior art, the present invention is characterized in that a resistive thin film is left in a contact hole to utilize the left film as an etching stopper, thereby both preventing dimensional variation of the contact hole and enlargement of the contact hole diameter. Consequently, the design margin can be reduced around the contact hole so as to achieve micronization.

By such an arrangement, design work around the contact hole can be freely done without regard to whether the thin film resistor is formed or not to thereby reduce the design work.

The present invention is also characterized in that electric connection is effected between the thin film resistor and the patterned aluminum film on a surface of the semiconductor substrate through an impurity-doped region of thick density and low resistance, which is junction-isolated and is capable of making ohmic contact with the thin film resistor, or that polysilicon layers are formed over and under the thin film resistor. By such an arrangement, removal of the thin film resistor can be prevented, which would be caused otherwise due to overetching during the course of etching of the insulating film prior to formation of the patterned aluminum film.

BRIEF DESCRIPTION OF THE DRAWINGS

FIGS. 3(a)-3(d) are a schematic diagram showing fabrication steps of the FIG. 1 embodiment of the inventive semiconductor device;

DETAILED DESCRIPTION OF THE INVENTION

Figure 1:
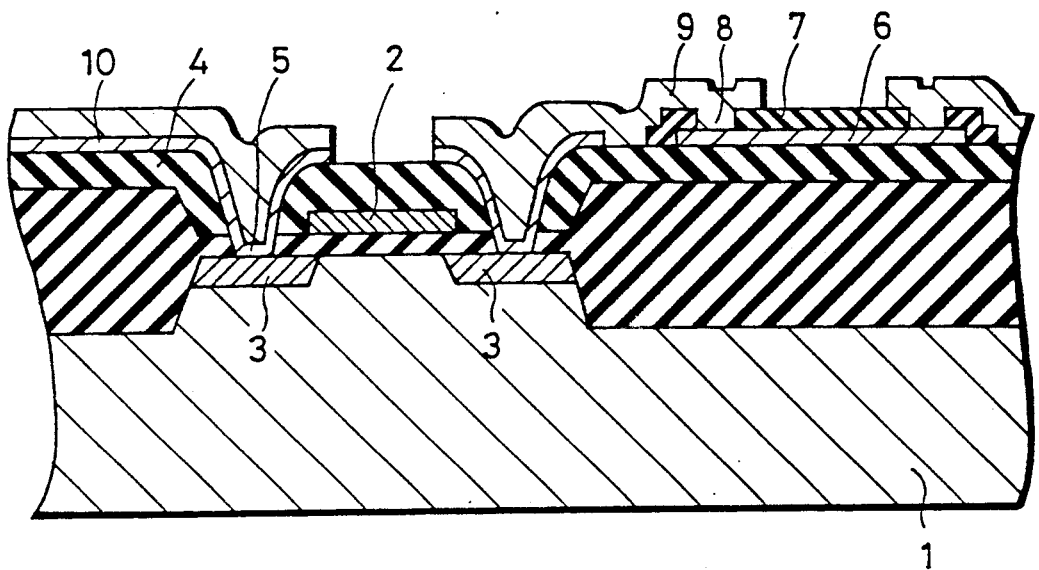
FIG. 1 is a sectional view of a semiconductor device showing an embodiment according to the present invention.
Figure 2:
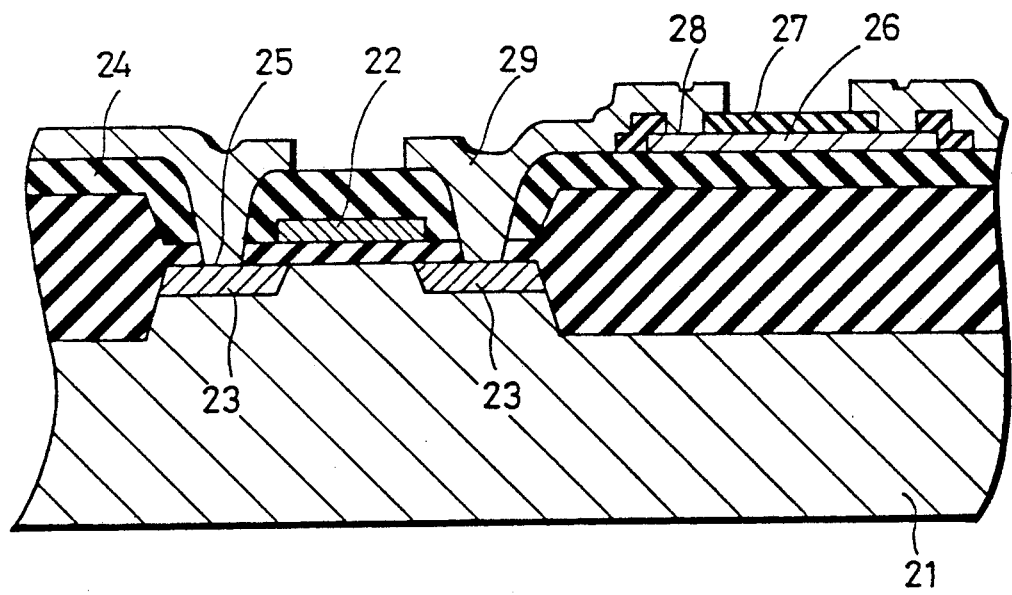
FIG. 2 is a sectional structural diagram of the conventional semiconductor device having a thin film resistor.

Hereinafter, embodiments of the present invention are described in detail with reference to the drawings. FIG. 1 is a structural section of a semiconductor device showing an embodiment of the present invention. A semiconductor substrate 1 has formed on its surface a MOS transistor composed of a gate electrode 2 and a pair of source and drain regions 3. An inter-layer insulating film 4 composed of BPSG film, etc. is deposited over the source and drain regions 3, and the gate electrode 2, and thereafter a contact hole 5 is opened in the insulating film. Further, a resistive thin film 10 is formed to cover the inside and around the contact hole 5. A patterned metal film 9 is disposed on the resistive thin film 10. A thin film resistor 6 is composed of the same resistive thin film 10 and is covered with another inter-layer insulating film 7. The thin film resistor 6 is electrically connected to the patterned metal film 9 through another contact hole 8 formed in the film 7.

In the FIG. 1 embodiment, either of the gate electrode 2 or the source and drain regions 3, is connected to the patterned metal film 9 through the resistive thin film 10. This thin film has relatively high resistance but a thickness less than 1000 Å to avoid increase in contact resistance. The contact hole 5 is covered by the resistive thin film 10 so that when carrying out etching to form the subsequent contact hole 8 on the thin film resistor 6 the resistive thin film 10 functions as an etching stopper effective to maintain the diameter of the contact hole 5.

FIGS. 3(a)-3(d) are an illustrative diagram showing fabrication steps of the inventive semiconductor device. In the step of FIG. 3(a), a gate electrode 2 and a pair of source and drain regions 3, are formed on a surface of a semiconductor substrate 1. Thereafter, a first inter-layer insulating film 4 composed of BPSG is deposited, and then a contact hole 5 is opened and subsequently subjected to reflow thermal treatment to smoothen the edge of the contact hole 5.

In the step of FIG. 3(b), a resistive thin film 10 is deposited over the substrate, and thereafter the film 10 is selectively etched and removed to leave at least a part thereof which covers the contact hole 5 and another part which forms a thin film resistor 6, i.e., a resistance element.

In the step of FIG. 3(c), a second inter-layer insulating film 7 is deposited on the thin film resistor 6, and thereafter another contact hole 8 is opened to expose a part of the thin film resistor 6. The unnecessary part of the second inter-layer insulating film 7 is removed by etching. The precedingly formed contact hole 5 has been covered by the resistive thin film 10. Therefore, during the course of etching of the second inter-layer insulating film 7 over the contact hole 5, the etching process can be stopped by the resistive thin film 10 to thereby avoid further etching of the first inter-layer insulating film 4 to maintain the initial dimension of the contact hole 5.

In the step of FIG. 3(d), a metal film 9 is deposited over the substrate, and thereafter the film 9 is selectively etched to effect patterning to thereby complete the semiconductor device. During the course of etching of the metal film 9, the resistive thin film 10 around the contact hole 5 is concurrently etched in registration with the patterned metal film 9.

Figure 4:
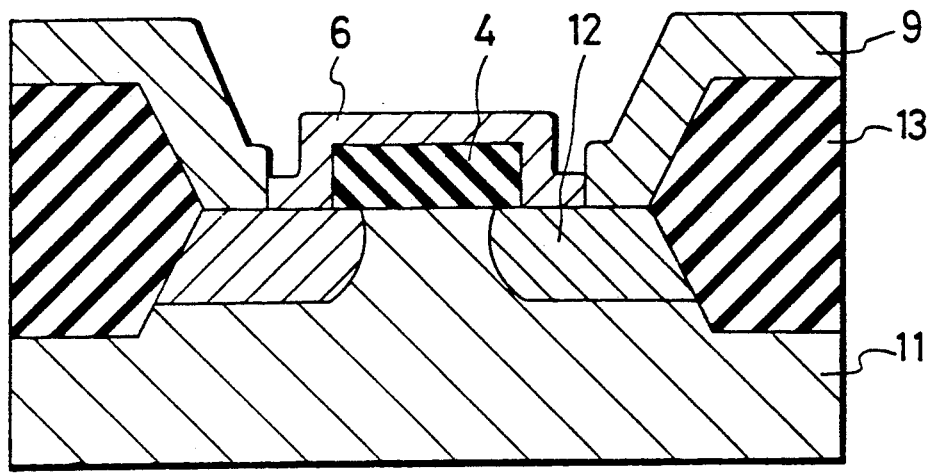
FIG. 4 is a sectional view of another embodiment showing electrical connection between a thin film resistor and a patterned aluminum film according to the present invention.

FIG. 4 shows another embodiment according to the present invention. This embodiment is constructed such that electrical connection is made between a thin film resistor 6 and a patterned aluminum film 9 through an n type diffusion region 12 of high impurity density. The n type diffusion region 12 is isolated from a p type silicon substrate 11 through p-n junction. An insulating film 13 or field oxide film is formed for element separation. The resistance value of the thin film resistor 6 is set more than several hundred k Ω while the contact resistance is in the order of several tens Ω between an aluminum-diffusion region and the thin film resistor. Therefore, the overall or effective resistance is substantially identical to that of the thin film resistor.

This means that a high resistance element can be controllably fabricated by patterning process of the thin film resistor 6.

In making of the embodiment, an under-layer oxide film 4 is formed on the p type silicon substrate 11 and is patterned in a desired shape. Then, phosphorus is introduced into the p type silicon substrate 11 by ion doping to form the n type diffusion region 12. Next, a resistive thin film is deposited over the substrate and is selectively etched away to form the thin film resistor 6. Lastly, an aluminum film is deposited over the substrate by sputtering etc., and is selectively etched to form the patterned aluminum film 9.

Figure 5:
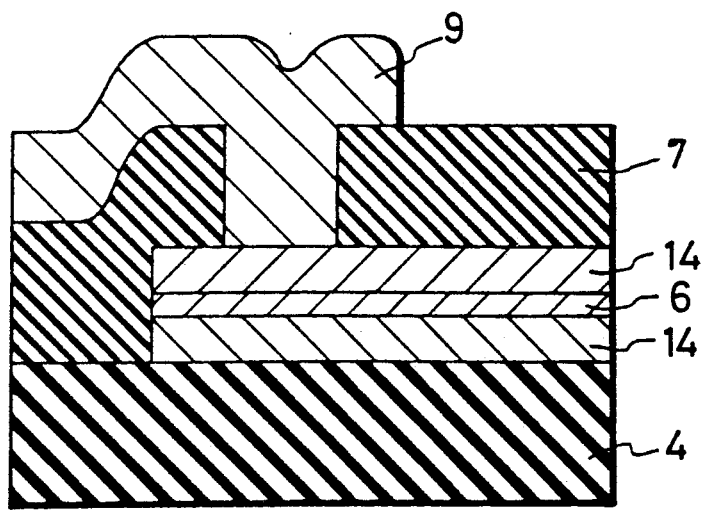
FIG. 5 is a sectional view of a further embodiment showing electrical connection between a thin film resistor and a patterned aluminum film.

FIG. 5 shows still another embodiment with regard to the electrical connection between a patterned aluminum film and a thin film resistor. In the FIG. 5 structure, polysilicon films 14 are disposed over and under a thin film resistor 6 made of tungsten. An under-layer oxide film 4 is disposed on a substrate (not shown). An insulating film 7 is disposed on the thin film resistor 6. A patterned aluminum film 9 is formed on the insulating film 7 in electrical contact with the thin film resistor 6 through the upper polysilicon film 14.

In making of the FIG. 5 device, the lower polysilicon film 14, resistive thin film 6 of tungsten and upper polysilicon film 14 are sequentially formed by a sputtering method on the under layer oxide film 4. Thereafter, this multi-layer is patterned in a desired shape. Then, the insulating film 7 is formed by a CVD method and a contact hole is formed in the film 7 by etching. Lastly, the aluminum film 9 is deposited by a sputtering method, etc. and is patterned in a desired configuration.

As described above, according to the present invention, a part of the resistive thin film is left inside and around the contact hole. By such arrangement, a subsequent contact hole can be formed to the resistive thin film while avoiding dimensional variation of the preceding contact hole to effect micronization of the semiconductor device and reduction of design work.

Further, electrical connection between the thin film resistor and the patterned aluminum film is made through an impurity-doped region of high density or through polysilicon layers disposed over and under the thin film resistor. By such construction, excessive removal of the tungsten thin film resistor can be effectively avoided, which would be caused otherwise due to overetching during the course of etching of an insulating film prior to the patterning of aluminum film, thereby ensuring firm electrical connection to provide practically reliable semiconductor device having a thin film resistor.

What is claimed is:

1. In a semiconductor device having a semiconductor substrate on whose surface are formed a MOS transistor having electrodes and a thin film resistor, the improvement comprising:

the thin film resistor being composed of a first resistive thin film sandwiched between a pair of polysilicon layers, one of the polysilicon layers being formed on an insulating film; and means defining a contact hole which is covered with a second resistive thin film and through which a patterned metal film connected to the thin film resistor is electrically connected to at least one of the MOS transistor electrodes.

2. A semiconductor device according to claim 1; wherein the thin film resistor is composed of tungsten.

3. A semiconductor device comprising: a substrate, a thin film resistor, a pair of polysilicon layers formed on upper and lower surfaces of the thin film resistor, a MOS transistor having source, drain and gate electrodes, a patterned metal film, and means defining a contact hole covered with a resistive thin film disposed in the same layer as that of the thin film resistor for electrically connecting the patterned metal film to at least one of the MOS transistor electrodes.

4. A semiconductor device according to claim 3; wherein the resistive thin film is composed of tungsten.

5. A semiconductor device comprising: a thin film resistor; a MOS transistor having source, drain and gate electrodes; insulating film means disposed over the thin film resistor and over the MOS transistor electrodes; means defining a first contact hole in the insulating film means to expose at least one of the MOS transistor electrodes; means defining a second contact hole in the insulating film means to expose the thin film resistor; a resistive film covering the surface portion of the insulating film means which defines the first contact hole and covering the at least one exposed MOS transistor electrode; and a metal film extending into the first and second contact holes and electrically connecting the thin film resistor to the at least one MOS transistor electrode through the resistive film.

6. A semiconductor device according to claim 5; wherein the thin film resistor and the resistive film comprise different portions of a commonly deposited thin resistive film layer.

7. A semiconductor device according to claim 6; wherein the thin resistive film layer is composed of tungsten.

8. A semiconductor device according to claim 5; wherein the thin film resistor is composed of tungsten.

9. A semiconductor device according to claim 8; wherein the resistive film is composed of tungsten.

* * * * *